(12) United States Patent
Saxer

(10) Patent No.: US 6,801,112 B1
(45) Date of Patent: Oct. 5, 2004

(54) DEVICE FOR SWITCHING A CONNECTION ACCORDING TO THE STATE OF AN APPARATUS TO BE MONITORED, ESPECIALLY A SAFETY SWITCH

(75) Inventor: Stefan Saxer, Sargans (CH)

(73) Assignee: Euchner GmbH & Co., Leinfelden-Echterdingen (DE)

( * ) Notice: Subject to any disclaimer, the term of this patent is extended or adjusted under 35 U.S.C. 154(b) by 0 days.

(21) Appl. No.: 09/958,596

(22) PCT Filed: Apr. 1, 2000

(86) PCT No.: PCT/EP00/02934

§ 371 (c)(1),
(2), (4) Date: Oct. 11, 2001

(87) PCT Pub. No.: WO00/64054

PCT Pub. Date: Oct. 26, 2000

(30) Foreign Application Priority Data

Apr. 16, 1999 (DE) ......................... 199 17 212

(51) Int. Cl.[7] ............................... H01H 9/00
(52) U.S. Cl. ..................... 335/205; 340/633
(58) Field of Search ............... 340/572.1, 633; 335/205–207

(56) References Cited

U.S. PATENT DOCUMENTS 5,752,299 A * 5/1998 Vivacqua et al. ............. 24/633
5,944,135 A * 8/1999 Blackburn et al. ........... 180/268
5,960,523 A * 10/1999 Husby et al. ................... 24/633
5,966,784 A * 10/1999 Arbogast et al. .............. 24/633
6,082,481 A * 7/2000 Engler .......................... 180/268
6,175,304 B1 * 1/2001 Becker ..................... 340/457.1
6,357,091 B1 * 3/2002 Devereaux .................... 24/633

FOREIGN PATENT DOCUMENTS

DE 19711588 9/1998
EP 0870653 10/1998

* cited by examiner

Primary Examiner—Lincoln Donovan
Assistant Examiner—Bernard Rojas
(74) Attorney, Agent, or Firm—Roylance, Abrams, Berdo & Goodman, LLP

(57) ABSTRACT

A device for switching a connection according to the state of an apparatus to be monitored, especially a safety switch, includes an actuator having first signaling device preferably be fixed on the apparatus to be monitored. The actuator can be brought into contact with an actuator receiver having a second signaling device and can be detachably held to prevent it from being withdrawn. A signal transfer can be carried out in a contactless manner between the first and the second signaling devices. The actuator and the actuator receiver are engaged in an interlocking manner when touching. The first and second signaling devices are arranged such that signal transfer between the actuator and the actuator receiver is only possible in the position in which they are engaged in an interlocking manner.

16 Claims, 2 Drawing Sheets

DEVICE FOR SWITCHING A CONNECTION ACCORDING TO THE STATE OF AN APPARATUS TO BE MONITORED, ESPECIALLY A SAFETY SWITCH

FIELD OF THE INVENTION

The present invention relates to a device for switching a connection depending on the state of an apparatus to be monitored, especially a safety switch.

BACKGROUND OF THE INVENTION

DE 196 24 172 A1 discloses a safety switch with an actuator which is mechanically polarized by its geometry. When inserted into a switch housing, the actuator turns a drum controller. Also, the safety switch has a transponder which, in the completely inserted state of the actuator, can be read out by a read/write device located in the switch housing.

EP 0870 653 discloses a belt lock. The position of a safety element, which secures the locking element of the belt tongue against unintentional spontaneous release and which is slidably movable, may be detected by means of a Hall probe and a magnet. In the event of manual actuation of the unlocking button of the belt lock, the safety element is displaced form its locking position.

DE 197 11 588 A1 discloses safety switches with an actuator which has a first signalling means fixed preferably on the apparatus to be monitored. The actuator can be brought together with an actuator receiver having a second signalling means, and can be removably blocked in it against pulling back. Between the first and the second signaling means, signal exchange can be done without contact. In the known safety switches, the actuator can be blocked in the united position by an axially movable plunger which fits through the opening of the actuator. Blocking or interlocking can be actuated both by spring force or magnetic force. In doing so, two pairs of signalling means which belong together are necessary in order first to detect the united state of the actuator and actuator receiver and second to detect the blocking state of the plunger.

SUMMARY OF THE INVENTION

Objects of the present invention are to provide a device which can be produced easily and economically, and still ensures permanently reliable holding closed and monitoring, in a wide variety of environments.

Only one pair of matched signalling means is necessary according to the present invention. If signals can be exchanged between these two signalling means, it is ensured that the actuator and the actuator receiver are brought together and blocked in this position. This arrangement is synonymous with the apparatus to be monitored, for example a safety means, such as a protective hood or a protective grating on a machine tool, being closed and secured in the closed state (closed and locked). In the course of bringing together the actuator and actuator receiver, their engagement to one another necessarily occurs, and thus, the position of blocking engagement is assumed. The signalling means are located on the actuator and actuator receiver such that only in the position of the blocking engagement is signal exchange possible. The matching signalling means can be made in different ways. For example, only one of the two signalling means can send a signal or information. The other signalling means issued essentially for complete or partial reflection of the emitted signal, for example, emission of light or ultrasound. Alternatively, the other signalling means can receive the emitted signal and send it back unchanged or individually changed to the signalling means. In doing so, analog and/or digital signals can be transmitted in one or both directions. Preferably, one of the signalling means also makes available energy for operation of the other signalling means in the form of electromagnetic radiation in the visible or invisible wavelength range. Signals can thus be exchanged without contact since the signals are not exchanged via electrical contacts, but can be transmitted wirelessly. Because the actuator is necessarily in blocking engagement with the actuator holder by their being brought together, a plunger that blocks the actuator can be omitted.

Because the actuator and actuator receiver have interworking blocking surfaces which are brought into blocking engagement with one another when the actuator and actuator receiver are brought together, and which block withdrawal of the actuator from the actuator receiver, self-locking is accomplished. In other words, the actuator is prevented from moving away from the actuator receiver, for example, due to vibration. The blocking surfaces can be made and/or aligned with respect to the insertion direction of the actuator such that the blocking forces increase when pulling on the actuator. The actuator can additionally be held by an energy storage mechanism or an electromagnet in the position of blocking engagement.

Because the blocking surfaces with the direction of motion of the actuator when bringing together include an angle from 0 to 90°, especially from 60 to 90°, self-locking is intensified and the blocking forces when pulling on the actuator are increased. Preferably, the blocking surfaces are made such that they hook into one another.

Because the first and second signalling means are located on the respective blocking surfaces and are opposite one another especially in the position of blocking engagement, it is ensured with especially simple means that signal exchange between the actuator and the actuator receiver is possible only in the position of blocking engagement of the actuator and the actuator receiver. Protection against false closing, i.e. protection against signal exchange although the actuator is still not yet blocked, is greatly increased.

Because the first and/or the second signalling means have a directional characteristic with at least one preferred spatial direction for signal exchange, protection against false closing is further increased since signal exchange is not possible when the two signal means approach. Only when the position of blocking engagement has been assumed and the two signalling means are directly adjacent, especially opposite, is the signal exchange possible.

Because the actuator can be swiveled, especially is fixed to be able to swivel on the apparatus to be monitored, it can be brought into blocking engagement with the generally stationary actuator receiver especially easily. The actuator can preferably be swivelled around an axis which includes a right angle with the insertion device or coincides with it. The actuator generally does not have its own power supply, i.e. the signalling means attached to it obtains its power, if necessary, from the electromagnetic field which has been built up by the second signalling means. Of course, in addition or alternatively, the actuator can also be movable. Also, the actuator receiver can be swivelled and/or movable.

Because the actuator assumes the position of blocking engagement when brought together with the actuator receiver as a result of the force due to its weight, an additional energy source for the blocking of the actuator is not necessary. If blocking is desirable or necessary in each installation position, in addition or alternatively, there can be blocking actuated by spring force or magnetic force.

Because signal exchange takes place electromagnetically, the safety and reliability of the device are further increased. Signal exchange can take place, for example, via electromagnetic waves or (ultra)sonic waves. In the case of electromagnetic waves, there is signal exchange by means of radio waves and by means of optical radiation. In both cases, energy transmission is also possible. In particular, signal exchange based on radio waves can be made available with standard components and thus economically. One signalling means transmitting the inquiry is received by the other signalling means and is sent back to the first signalling means unchanged or optionally individually changed. In this way, for example, detection and identification of the actuator are possible.

Because the blocking engagement is released as a result of electromagnetic force or by means of compressed air supply, opening, for example, a protective hood for a machine tool can be controlled by the control for the machine tool. Alternatively or in addition, release by means of a cable, for example a Bowden cable, is possible. The actuator and the actuator receiver can be made such that a one-time release pulse leads to motion out of the position of blocking engagement, and thus, to unblocking which enables subsequent and optionally time-staggered opening and removal of the actuator.

Other objects, advantages and salient features of the present invention will become apparent from the following detailed description, which, taken in conjunction with the annexed drawings, discloses preferred embodiments of the present invention.

BRIEF DESCRIPTION OF THE DRAWINGS

Referring to the drawings which form a part of this disclosure.

DETAILED DESCRIPTION OF THE INVENTION

Figure 1:
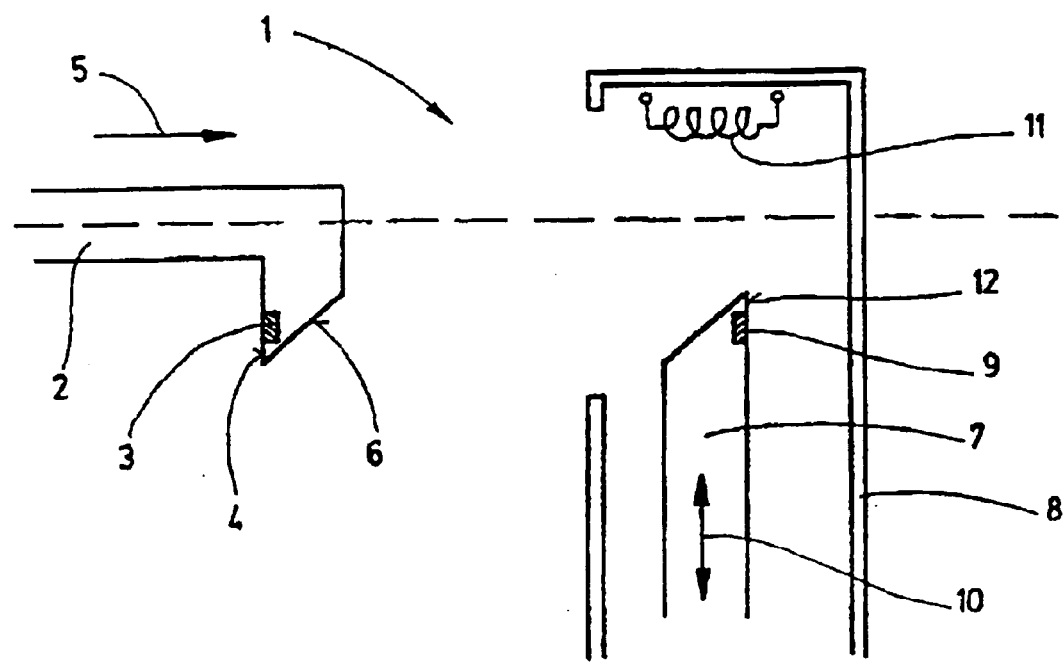
FIG. 1 is a side elevational view of a device before the actuator is brought together with the actuator receiver according to a first embodiment of the present invention.

FIG. 1 shows a device 1 according to a first embodiment of the present invention before the actuator or actuator member 2 is moved to engage the actuator receiver 7. The device 1 is shown only schematically, and especially is not to scale. For reasons of clarity, the apparatus to be monitored is not shown. The actuator 2 has a first signalling means 3 which can be, for example, a so-called transponder module. The first signal means 3 is located on a blocking surface 4 which includes essentially a right angle with the direction 5 of motion of the actuator 2 toward actuator receiver 7. The actuator 2 has an insertion bevel 6 including an angle between 0 and 90° with the direction 5. In this embodiment that angle is 45°. The actuator 2 can swivel or pivot around an axis perpendicular to the plane of the drawing in FIG. 1 and/or can be moved in the direction including a right angle with the direction 5.

The actuator receiver 7 is located within the housing 8 for essentially protecting against manipulation of the device 1. The actuator receiver 7 has a second signalling means 9 and can movable in addition and/or alternatively to the mobility of the actuator 2 under the action of an energy source or an energy storage in the direction of the double arrow 10. A magnetic coil 11, shown schematically and located in the housing 8, is used to raise and/or swivel the actuator 2 which has been brought together with the actuator receiver 7 to release the block. The actuator receiver 7 forms a second blocking surface 12 which essentially forms a right angle with the direction 5 of the actuator.

Figure 2:
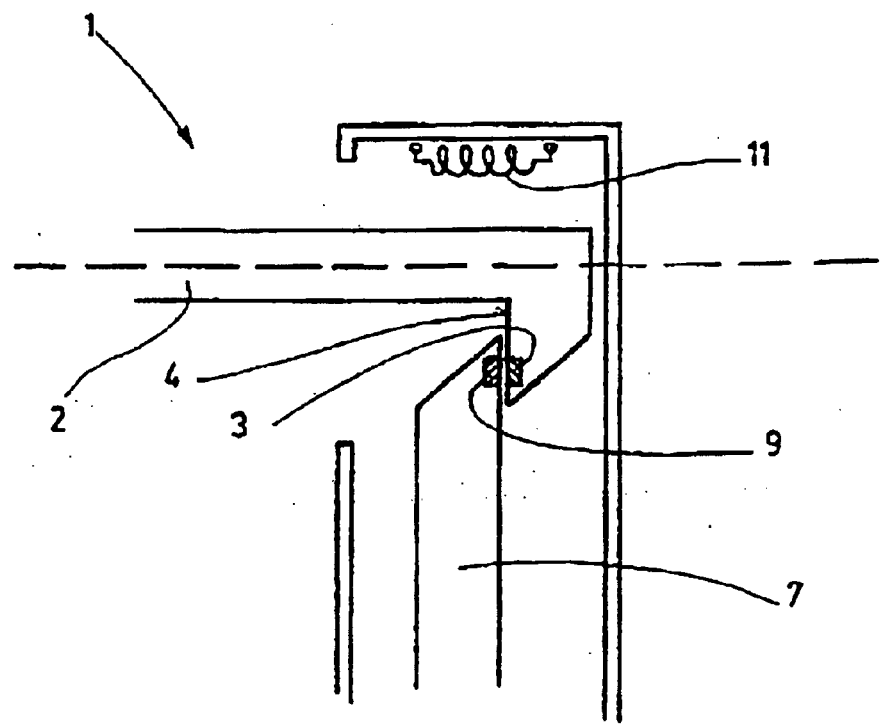
FIG. 2 is a side elevational view of the device of FIG. 1 in a blocking position with the actuator engaging the actuator receiver.

FIG. 2 shows the device of the present invention in the position of blocking engagement of the actuator 2 and actuator receiver 7. Here, the first signalling means 3 of the actuator 2 and the second signalling means 9 of the actuator receiver 7 are directly adjacent and especially opposite one another. The first blocking surface 4 of the actuator 2 is opposite the second blocking surface 12 of the actuator receiver 7. Under a tensile load of the actuator 2 in a direction opposite the direction 5, the two blocking surfaces 4, 12 come into contact with one another and block further motion of the actuator 2. Advantageously in this embodiment, the two signalling means 3, 9 are directly adjacent only when the actuator 2 is in the position of blocking engagement with the actuator receiver 7. Signal exchange is only possible when the position of blocking engagement has been reliably assumed. To release the position of blocking engagement, for example, a current pulse to the magnetic coil 11 and pulling out the actuator opposite the direction 5 are necessary.

Figure 3:
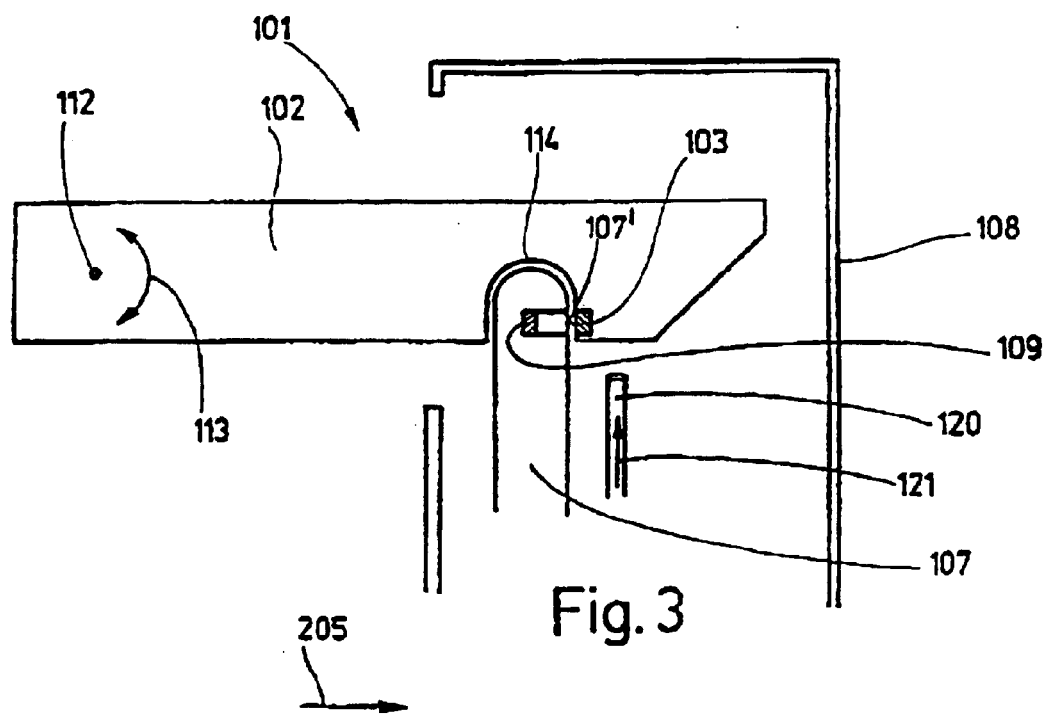
FIG. 3 is a side elevational view of a device according to a second embodiment of the present invention.

FIG. 3 shows a device 101 according to a second embodiment of the present invention. The actuator 102 is coupled to swivel or pivot around the axis 112 in the direction of the double arrow 113. The actuator 102 has a receiver 114 in the shape of a blind hole or slot for the actuator receiver 107. The receiver 114 and the actuator receiver 107 are made hemispherical and/or semicircular in cross section on their respective end sections. The first signalling means 103 in the actuator 102 is illustrated in the position of blocking or engagement relative to the second signalling means 109 of the actuator receiver 107. The second signalling means 109 is set back from the wall 107' facing the first signalling means 103 in order to achieve a directional characteristic of signal emission in cooperation with the actuator 102 which is metallic at least in this area. This directional characteristic further increases the level of protection against a false closing signal of the device 101. The release from the position of blocking engagement takes place in this embodiment by supplying compressed air via the nozzle 120 in the direction of the arrow 121. The compressed air emerging from the nozzle 120 swivels the actuator 102 around the axis 112 so far that the withdrawal of the actuator 102 is no longer blocked by the actuator receiver 107.

Figure 4:
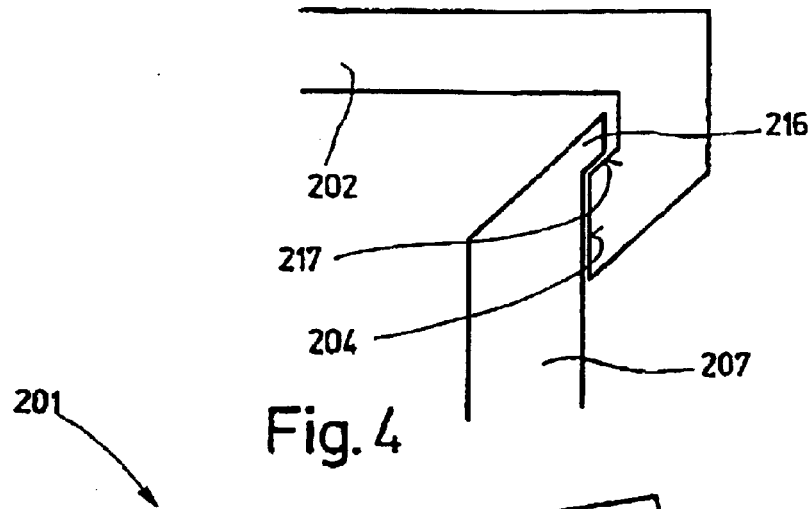
FIG. 4 is a side elevational view of a device in the blocking/engaging position according to a third embodiment of the present invention.

FIG. 4 shows a device 201 according to a third embodiment of the present invention in the position of blocking engagement. The actuator receiver 207 forms a catch tooth 216 which fits behind the first blocking surface 204 of the actuator 202. The actuator 202 forms a slanted shoulder surface 217 which includes an angle between 0 and 90° with the direction 205, in this embodiment an angle of 45°. This configuration has the advantage, when the actuator 202 is pulled opposite the direction 205, the blocking action is enhanced.

Figure 5:
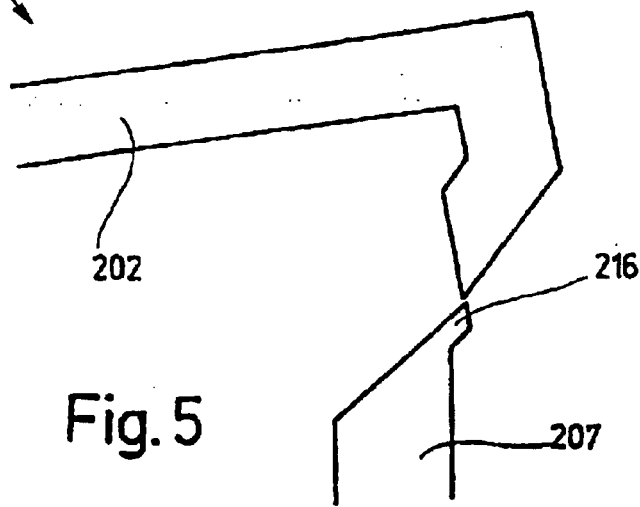
FIG. 5 is a side elevational view of the device of FIG. 4 in a released position.

FIG. 5 shows the device 201 of FIG. 4 in the position released from blocking engagement. By means of a short mechanical, magnetic and/or compressed air pulse, the actuator 202 has been pivoted around the swivelling axis located outside the illustrated area. After the end of the pulse, actuator 202 remains on the catch tooth 216 of the actuator receiver 207 so that the actuator 202 does not assume the position of blocking engagement again and can be pulled out of the device with a certain time delay.

While various embodiments have been chosen to illustrate the invention, it will be understood by those skilled in the art that various changes and modifications can be made therein without departing from the scope of the invention as defined in the appended claims.

What is claimed is:

1. A device for switching a connection depending on states of an apparatus to be monitored, comprising:

an actuator member having a first signalling means;

an actuator receiver, said actuator member and said actuator receiver being relatively movable between a blocking position in which said actuator receiver is engaged and releasably locked with said actuator member to removably block said actuator member from being withdrawn from said actuator receiver and a release position in which said actuator member and said actuator receiver are disengaged and separated from one another; and second signalling means on said actuator receiver, said first and second signalling means exchanging signals without contact therebetween only when said actuator member and said actuator receiver are in said blocking position.

2. A device according to claim 1 wherein the connection is a safety switch.

3. A device according to claim 1 wherein said actuator member is fixed on the apparatus to be monitored.

4. A device according to claim 1 wherein said actuator member and said actuator receiver have first and second blocking surfaces, respectively, engaging one another in said blocking position.

5. A device according to claim 4 wherein said blocking surfaces are at an angle between 0° and 90° relative a direction of motion from said release position to said blocking position.

6. A device according to claim 5 wherein said angle is 60° to 90°.

7. A device according to claim 4 wherein said first and second signalling means are located on said first and second blocking surfaces, respectively.

8. A device according to claim 7 wherein said signalling means are opposite one another in said blocking position.

9. A device according to claim 1 wherein said first and second signalling means have a directional characteristic directed at one another for signal exchange.

10. A device according to claim 1 wherein said actuator member is pivoted between said blocking position and said release position.

11. A device according to claim 1 wherein said actuator is biased by a weight thereof toward engagement with said actuator receiver in said blocking position.

12. A device according to claim 1 wherein said first and second signalling mean exchange signals electromagnetically.

13. A device according to claim 4 wherein a source of electromagnet force moves said actuator member and said actuator receiver to said release position.

14. A device according to claim 4 wherein a supply of compressed air moves said actuator member and said actuator receiver to said release position.

15. A device according to claim 1 wherein said second signalling means initially transmits a signal to the first signalling means which produces a modified signal received by said second signalling means;

whereby, modification of the signal detects presence of an approved actuator member.

16. A device according to claim 4 wherein said first and second signalling means are adjacent said first and second blocking surfaces, respectively.

* * * * *